(12) United States Patent
Furuie et al.

(10) Patent No.: US 9,287,340 B2
(45) Date of Patent: Mar. 15, 2016

(54) DISPLAY DEVICE

(71) Applicant: Japan Display Inc., Tokyo (JP)

(72) Inventors: Masamitsu Furuie, Tokyo (JP); Toshihiro Sato, Tokyo (JP); Kazuhiro Odaka, Tokyo (JP); Naoki Tokuda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/521,500

(22) Filed: Oct. 23, 2014

(65) Prior Publication Data

US 2015/0115274 A1 Apr. 30, 2015

(30) Foreign Application Priority Data

Oct. 24, 2013 (JP) ................................. 2013-221632

(51) Int. Cl.
*H01L 27/32* (2006.01)
*H01L 51/00* (2006.01)

(52) U.S. Cl.
CPC ........ *H01L 27/3276* (2013.01); *H01L 51/0097* (2013.01); *H01L 27/3246* (2013.01); *H01L 27/3248* (2013.01); *H01L 27/3262* (2013.01)

(58) Field of Classification Search
CPC ............ H01L 27/3276; H01L 27/3262; H01L 27/3248; H01L 27/3246
See application file for complete search history.

(56) References Cited

U.S. PATENT DOCUMENTS

| | | | | |
|---|---|---|---|---|
| 6,501,528 B1* | 12/2002 | Hamada | ............ | G02F 1/133305 345/4 |
| 6,822,164 B2* | 11/2004 | Tsuji | .................. | G02F 1/13452 174/549 |
| 9,081,461 B2* | 7/2015 | Mamba | .................... | G06F 3/046 |
| 2005/0285826 A1* | 12/2005 | Park | ...................... | G09G 3/3233 345/76 |
| 2006/0001792 A1* | 1/2006 | Choi | .................... | G02F 1/13458 349/54 |
| 2007/0097286 A1* | 5/2007 | Oohira | ................. | G02B 6/0088 349/58 |
| 2008/0049156 A1* | 2/2008 | Kim | ................... | G02F 1/136286 349/40 |
| 2008/0055291 A1* | 3/2008 | Hwang | .................. | H05K 3/361 345/204 |
| 2008/0061422 A1* | 3/2008 | Han | ..................... | G02F 1/13394 257/686 |
| 2013/0147692 A1* | 6/2013 | Yamashita | ........... | G09G 3/3233 345/76 |
| 2015/0194109 A1* | 7/2015 | Fujikawa | ............ | G02F 1/13454 345/100 |

FOREIGN PATENT DOCUMENTS

JP 2012-220636 A 11/2012

* cited by examiner

*Primary Examiner* — Ida M Soward
(74) *Attorney, Agent, or Firm* — Typha IP LLC

(57) ABSTRACT

Provided is a display device (1a), including: a substrate on which a plurality of pixels are arranged in a display region; a plurality of connection pads (C) provided on one surface of the substrate; and wires connecting the plurality of pixels and the plurality of connection pads to each other, the substrate including: a panel portion in which the plurality of pixels are arranged; and a terminal portion (30) in which the plurality of connection pads are arranged, the terminal portion including: a first portion (32) continuing to a first direction side of the panel portion; and a second portion (34) opposing the first portion, the second portion being formed by bending a portion of the terminal portion, the plurality of connection pads being arranged in the first portion and the second portion.

6 Claims, 15 Drawing Sheets

DISPLAY DEVICE

CROSS-REFERENCE TO RELATED APPLICATION

The present application claims priority from Japanese application JP 2013-221632 filed on Oct. 24, 2013, the content of which is hereby incorporated by reference into this application.

BACKGROUND OF THE INVENTION

1. Field of the Invention

The present invention relates to a display device.

2. Description of the Related Art

A display device including pixel circuits arranged in matrix on a substrate has been developed as a thin and lightweight light emitting source.

In a display device disclosed in JP 2012-220636 A, a configuration has been disclosed in which wires connected to respective organic electroluminescence light emitting elements and connection pads connected to the respective wires are provided on a flexible substrate having a panel portion and a terminal portion. The organic electroluminescence light emitting elements are arranged in the panel portion of the flexible substrate, and the wires and connection pads are arranged in the terminal portion of the flexible substrate.

SUMMARY OF THE INVENTION

According to such a display device configuration, as the resolution of the display device increases and the number of pixel circuits increases, the number of wires that are required increases. However, the width of the connection pads is larger than the width of the wires, and hence as the number of wires increases, it is difficult to arrange all of the connection pads in the terminal portion. Further, if the width of the terminal portion is increased to allow all of the connection pads to be arranged, the width of the panel portion also increases, which causes difficulty in reducing the size of the display device.

The present invention has been made in view of such circumstances, and has an object to realize a high-resolution and compact display device.

Among the embodiments of the present invention disclosed in this application, a summary of representative embodiments is briefly described below.

(1) According to one embodiment of the present invention, there is provided a display device, including: a substrate on which a plurality of pixels are arranged in a display region; a plurality of connection pads provided on one surface of the substrate; and wires connecting the plurality of pixels and the plurality of connection pads to each other, the substrate including: a panel portion in which the plurality of pixels are arranged; and a terminal portion in which the plurality of connection pads are arranged, the terminal portion including: a first portion continuing to a first direction side of the panel portion; and a second portion opposing the first portion, the second portion being formed by bending a portion of the terminal portion, the plurality of connection pads being arranged in the first portion and the second portion.

(2) In the display device according to one embodiment of the present invention as described in Item (1), a sum of a width in a second direction, which is a direction orthogonal to the first direction, of the first portion and a width in the second direction of the second portion may be greater than a width in the second direction of the panel portion.

(3) In the display device according to one embodiment of the present invention as described in Item (1), a side surface on the first direction side of the first portion and a side surface on the first direction side of the second portion may overlap in a planar view.

(4) In the display device according to one embodiment of the present invention as described in Item (1), the second portion may include: a first sub-portion; and a second sub-portion, and the first sub-portion may be connected to an edge on one side of the first portion. In the display device, the second sub-portion may be connected to an edge on another side of the first portion, and an edge portion on the second direction side of the first sub-portion may face an edge portion on the second direction side of the second sub-portion of the another side.

(5) The display device according to one embodiment of the present invention may further include a driver IC connected to a plurality of the connection pads, the driver IC being arranged on the terminal portion so as to avoid a boundary between the first portion and the second portion.

(6) In the display device according to one embodiment of the present invention as described in Item (1), a surface on an opposite side to the one surface of the first portion and a surface on an opposite side to the one surface of the second portion may be fixed through intermediation of a reinforcing member.

DETAILED DESCRIPTION OF THE INVENTION

A display device according to a first embodiment of the present invention is described below with reference to the drawings based on an organic electroluminescence display device 1a (hereinafter referred to as display device 1a) as an example. Note that, for convenience, the drawings referred to in the following description in some cases show the portions serving as characteristic features in an expanded manner, and hence the ratio of the dimensions and the like between the respective components may not be the same as for an actual case. Further, the materials and the like mentioned in the following description are examples. The components are not limited to these examples, and can be modified without departing from the scope of the present invention.

Figure 1:
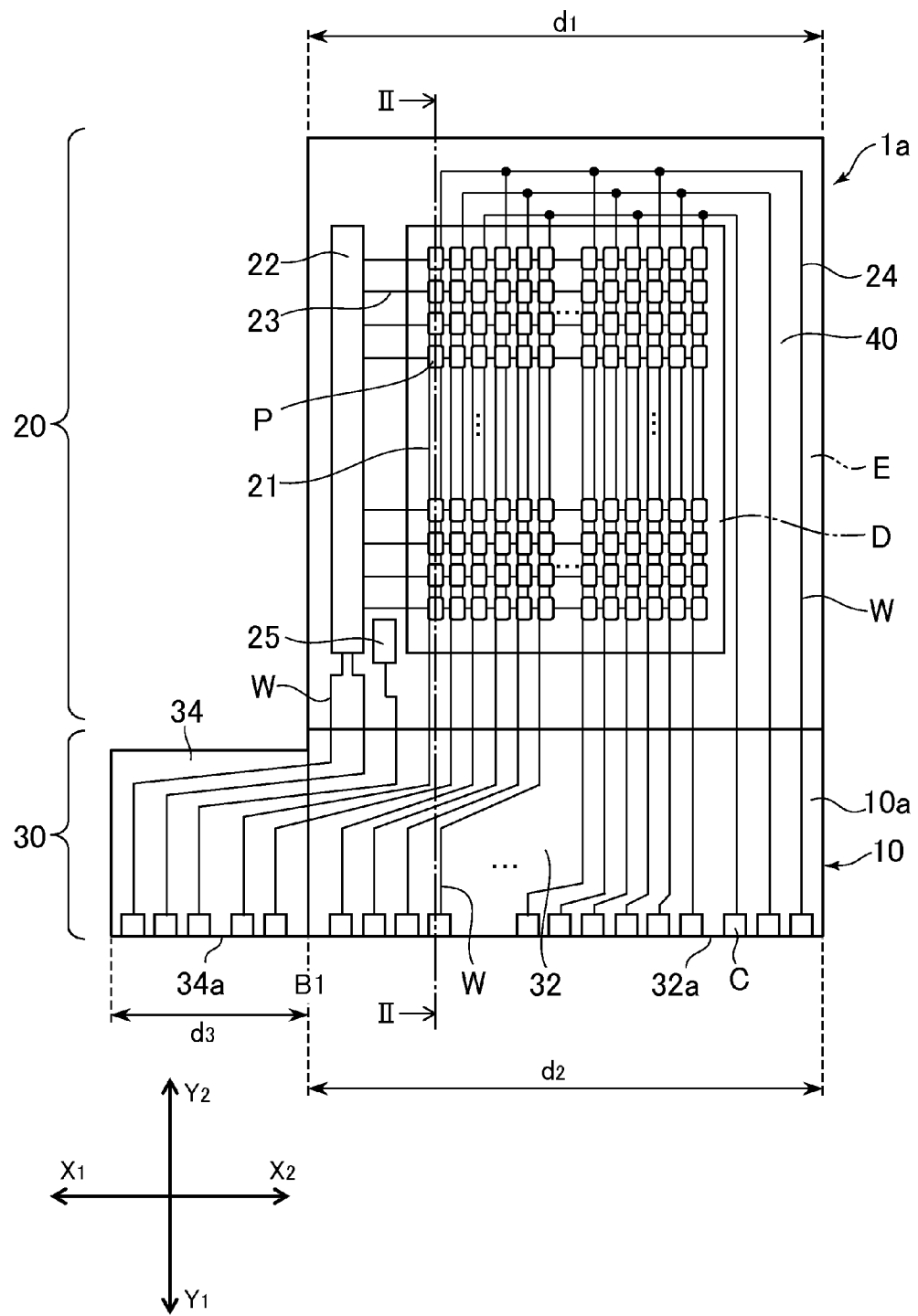
FIG. 1 is a schematic plan view illustrating a state in which a display device according to a first embodiment of the present invention has developed a terminal portion.
Figure 2:
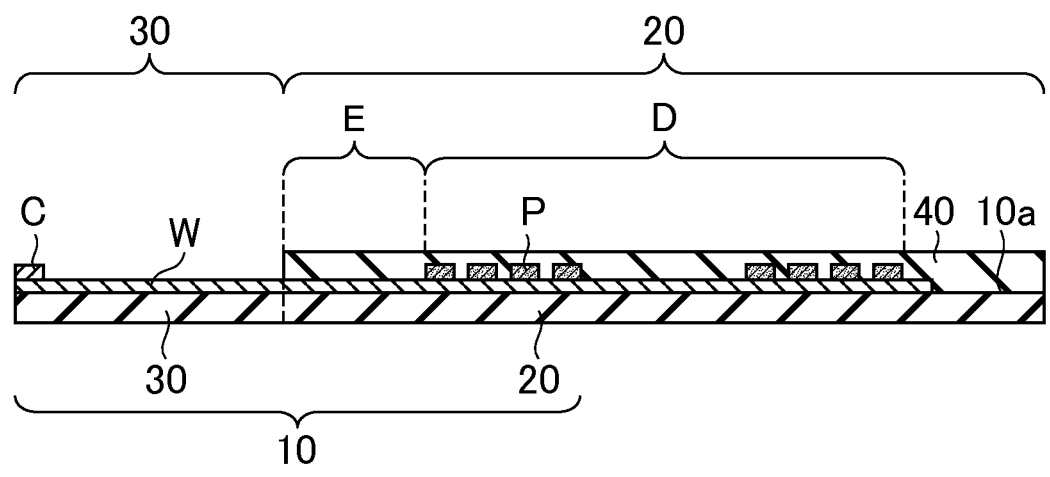
FIG. 2 is a schematic cross-sectional view taken along the line II-II of the display device illustrated in FIG. 1.

FIG. 1 is a schematic plan view illustrating a state in which the display device 1a according to the first embodiment of the present invention has developed a terminal portion 30. FIG. 2 is a schematic cross-sectional view taken along the line II-II of the display device 1a illustrated in FIG. 1. The display device 1a includes a substrate 10, a plurality of connection pads C provided on an upper surface (one surface) 10a of the substrate 10, and wires W connecting pixels P and the connection pads C to each other.

The substrate 10 is configured so that a plurality of pixels P are arranged in matrix on the one surface 10a of the substrate 10. In the substrate 10, a portion where the pixels P are arranged on the one surface 10a is referred to as a panel portion 20, and a portion where the connection pads C are arranged is referred to as the terminal portion 30. A plurality of wires W are provided on the upper face 10a of the substrate 10. Each wire W corresponds to any one of the columns of the pixels P arranged in the matrix.

The terminal portion 30 of the substrate 10 is formed of a bendable material. Examples of the bendable substrate 10 include a flexible plastic resin substrate, such as of polyimide and polyethylene terephthalate, which has been subjected to a moisture-proofing treatment. Further, the material of the substrate 10 is not limited to a resin substrate, and may be a flexible metal thin sheet of stainless steel, copper, and the like, which has been subjected to insulating treatment.

In the panel portion 20, a region on which an image is displayed is referred to as a display region D, and a region that is on an outer side of the display region D and on which an image is not displayed is referred to as a non-display region E. The pixels P are arranged in the display region D. Further, in the display region D, an insulating layer, a circuit layer including a thin-film transistor, an organic electroluminescence element, and the like (not shown) are formed. Each of the pixels P is connected to the other pixels by a data line 21.

In the non-display region E, a scanning line drive circuit 22, scanning lines 23, power supply lines 24, and a cathode connection pad 25 are arranged. The scanning line drive circuit 22, which is a circuit for outputting a scanning signal to the pixels P, is connected to the pixels P via the scanning lines 23. The power supply lines 24, which are wires for supplying a current to the organic electroluminescence elements (not shown) provided in the pixels P, are connected to the connection pads C. The cathode connection pad 25 is an electrode into which electrons flow from an external device (not shown) by connecting the external device to the connection pads C.

As illustrated in FIG. 2, the one surface 10a of the panel portion 20 is covered by a protective film 40 formed of an insulating material. The protective film 40 is a flexible film for protecting the pixels P. The film structure of the protective film 40 is not especially limited, as long as the protective film 40 covers the display region D of the one surface 10a. For example, the protective film 40 may be a flexible, transparent resin substrate arranged on the one surface 10a with a sealing agent provided therebetween.

As illustrated in FIGS. 1 and 2, the connection pads C are arranged on a first direction side ($Y_1$ direction side) on the one surface 10a of the terminal portion 30. The connection pads C are connection terminals for connecting the display device 1a to an external device (not shown).

The connection pads C in the terminal portion 30 are connected to the respective pixels P in the panel portion 20 by the wires W provided on the one surface 10a of the substrate 10. The wires W supply a scanning signal, a data signal, and power to the respective pixels P via the connection pads C from the external device (not shown).

Figure 3:
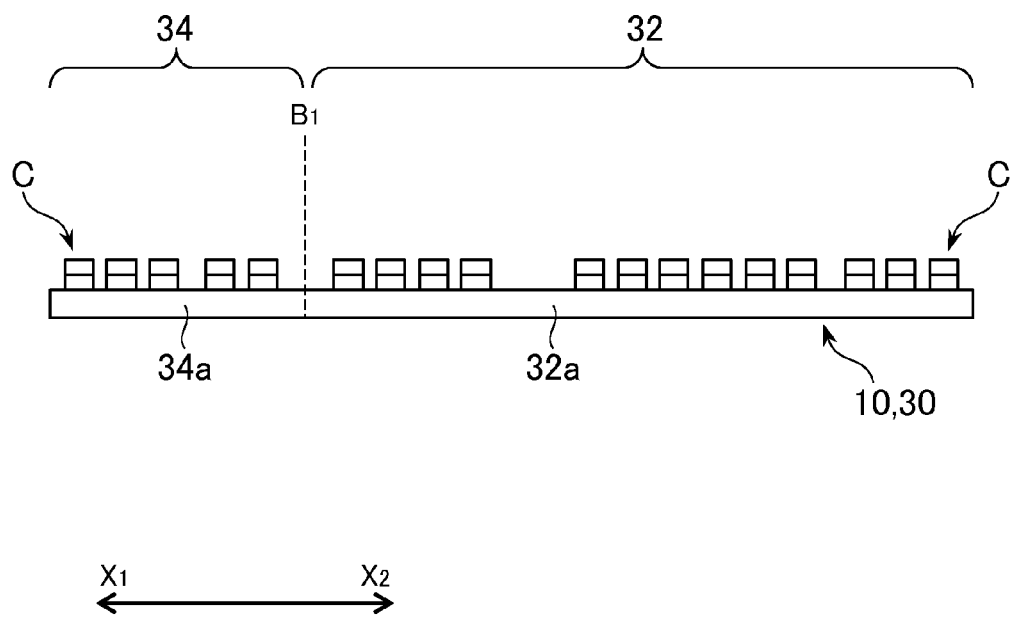
FIG. 3 is a schematic side view illustrating the display device illustrated in FIG. 1 in a field of view from a first direction side.

Next, the configuration of the terminal portion 30 is described in more detail. FIG. 3 is a schematic side view illustrating the display device 1a illustrated in FIG. 1 in a field of view from the first direction side. In this embodiment, "first direction side" refers to the side in the $Y_1$ direction shown in FIG. 1.

As illustrated in FIGS. 1 and 3, the terminal portion 30 has a first portion 32 continuing to the first direction side ($Y_1$ direction side) of the panel portion 20 and a second portion 34 continuing to a second direction ($X_1$ direction) side, for example, of the first portion 32. The second direction ($X_1$ direction) according to this embodiment is a direction orthogonal to the first direction ($Y_1$ direction). Further, at an edge portion on the $Y_1$ direction side of each of the first portion 32 and the second portion 34, the connection pads C are arranged so as to avoid a boundary $B_1$ between the first portion 32 and the second portion 34.

When the side surface on the first direction side ($Y_1$ direction side) of the first portion 32 is referred to as a side surface 32a, and the side surface on the first direction side of the second portion 34 is referred to as a side surface 34a, in a planar view, the side surface 32a and the side surface 34a have a continuous linear shape.

As illustrated in FIG. 1, a sum of a width $d_2$ in the second direction ($X_1$ direction) of the first portion 32 and a width $d_3$ in the second direction of the second portion 34 is greater than a width $d_1$ in the second direction of the panel portion 20. In this embodiment, although the width $d_2$ of the first portion 32 is the same size as the width $d_1$ of the panel portion 20, the width $d_2$ of the first portion 32 is only required to be equal to or smaller than the width $d_1$ of the panel portion 20.

Figure 4:
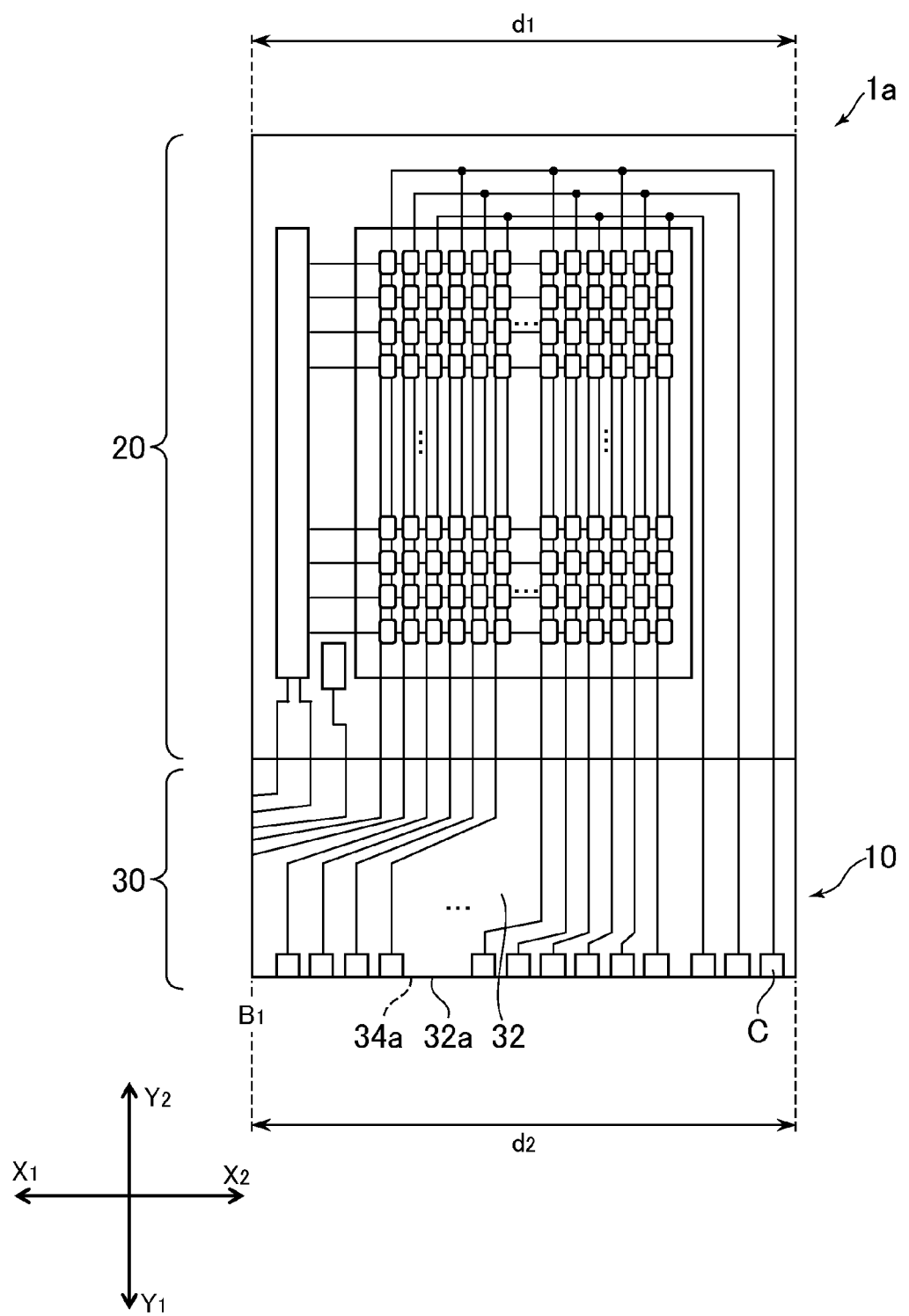
FIG. 4 is a schematic plan view illustrating a state in which a portion of the terminal portion of the display device illustrated in FIG. 1 is bent.

The second portion 34 is formed so as to be bendable from the first portion 32 at the boundary $B_1$. FIG. 4 is a schematic plan view illustrating a state in which a portion (the second portion 34) of the terminal portion 30 of the display device 1a illustrated in FIG. 1 is bent. The second portion 34 is bent at the boundary $B_1$, and hence the width $d_1$ in the second direction of the panel portion 20 and the width $d_2$ in the second direction of the terminal portion 30 in a planar view shape are the same.

It is preferred that the second portion 34 be bent so that the side surface 32a of the first portion 32 and the side surface 34a of the second portion 34 overlap in a planar view. This is to facilitate connection of the terminal portion 30 to the external device when the second portion 34 is in a bent state.

Figure 5:
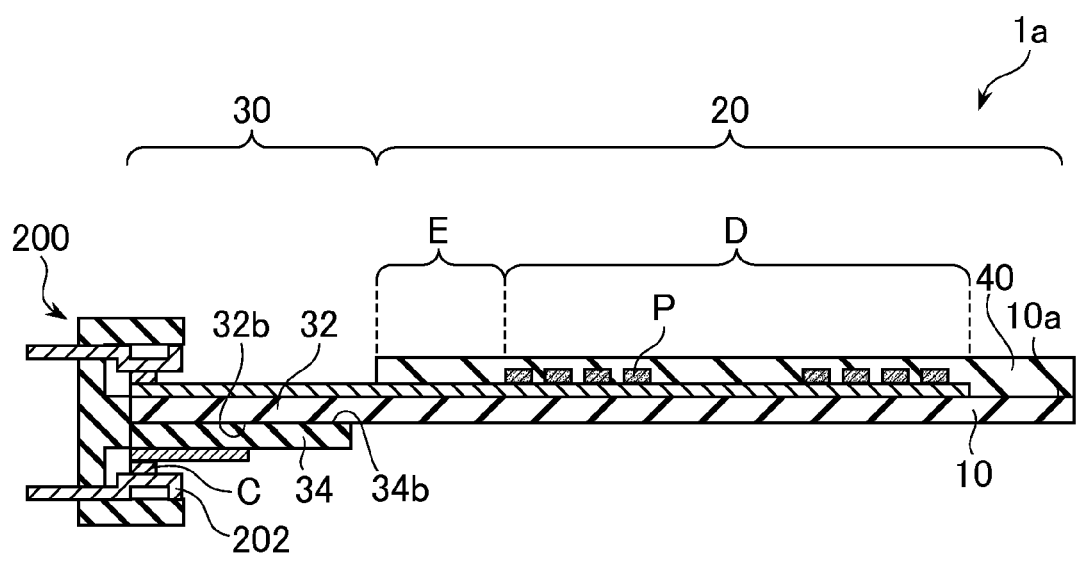
FIG. 5 is a schematic side view illustrating a state in which the display device illustrated in FIG. 4 is connected to an external device in the same field of view as FIG. 2.
Figure 6:
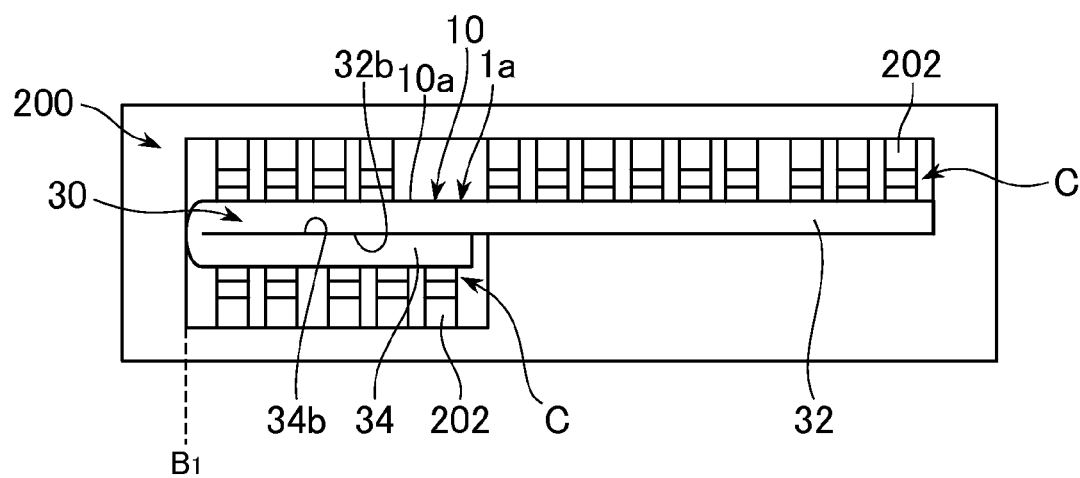
FIG. 6 is a schematic side view illustrating a state in which the display device illustrated in FIG. 4 is connected to an external device in the same field of view as FIG. 3.

FIG. 5 is a schematic side view illustrating a state in which the display device 1a illustrated in FIG. 4 is connected to an external device (connector 200) in the same field of view as FIG. 2. FIG. 6 is a schematic side view illustrating a state in which the display device 1a illustrated in FIG. 4 is connected to an external device in the same field of view as FIG. 3.

A plurality of connector pins 202 are arranged on an inner side of the connector 200 based on the shape of the terminal portion 30 in a bent state and the position of the connection pads C. By connecting the terminal portion 30 to the connector 200 with a portion (the second portion 34) of the terminal portion 30 in a bent state, the connector pins 202 and the connection pads C are electrically connected to each other.

As illustrated in FIGS. 5 and 6, the bent second portion 34 of the terminal portion 30 opposes the first portion 32. Specifically, the second portion 34 is bent so that another surface 32b of the first portion 32, which is the surface on the opposite side to the one surface 10a of the substrate 10, opposes another surface 34b of the second portion 34.

The display device 1a according to this embodiment is configured so that a portion (the second portion 34) of the terminal portion 30 is bent, and the connection pads C are arranged on both the first portion 32 and the second portion 34. With this, compared with a display device that does not have this configuration, the display device 1a according to this embodiment includes a greater number of connection pads C arranged on the terminal portion 30 without increasing the width in the second direction. Consequently, a high-resolution and compact display device can be realized.

Further, with the display device 1a according to this embodiment, there is no increase in the width in the second direction of the terminal portion 30 even if more connection pads C are arranged on the terminal portion 30 than a display device that does not have this configuration. Consequently, an increase in the size of an external device, such as the connector 200, can also be avoided.

Still further, when the terminal portion 30 is in a developed state, the display device 1a according to this embodiment can increase the width in the second direction of the terminal portion 30 more than a display device that does not have this configuration. Consequently, variation in the arrangement of the connection pads C, the wires W, and the like of the terminal portion 30 can be increased. This enables the options for the drive method for the pixels P to be increased, and an improvement in the quality of the display device 1a to be realized.

In addition, in the display device 1a according to this embodiment, the sum of the width $d_2$ in the second direction of the first portion 32 and the width $d_3$ in the second direction of the second portion 34 is greater than the width $d_1$ in the second direction of the panel portion 20. Consequently, a greater number of connection pads C can be arranged than for a display device in which the width in the second direction of the terminal portion is the same as the width in the second direction of the panel portion.

Still even further, in the display device 1a according to this embodiment, the side surface 32a on the first direction side of the first portion 32 and the side surface 34a on the first direction side of the second portion 34 overlap in a planar view. Consequently, the terminal portion 30 in a state in which the second portion 34 is bent can be connected more easily to an external device such as the connector 200 than a display device that does not have this configuration.

Figure 7:
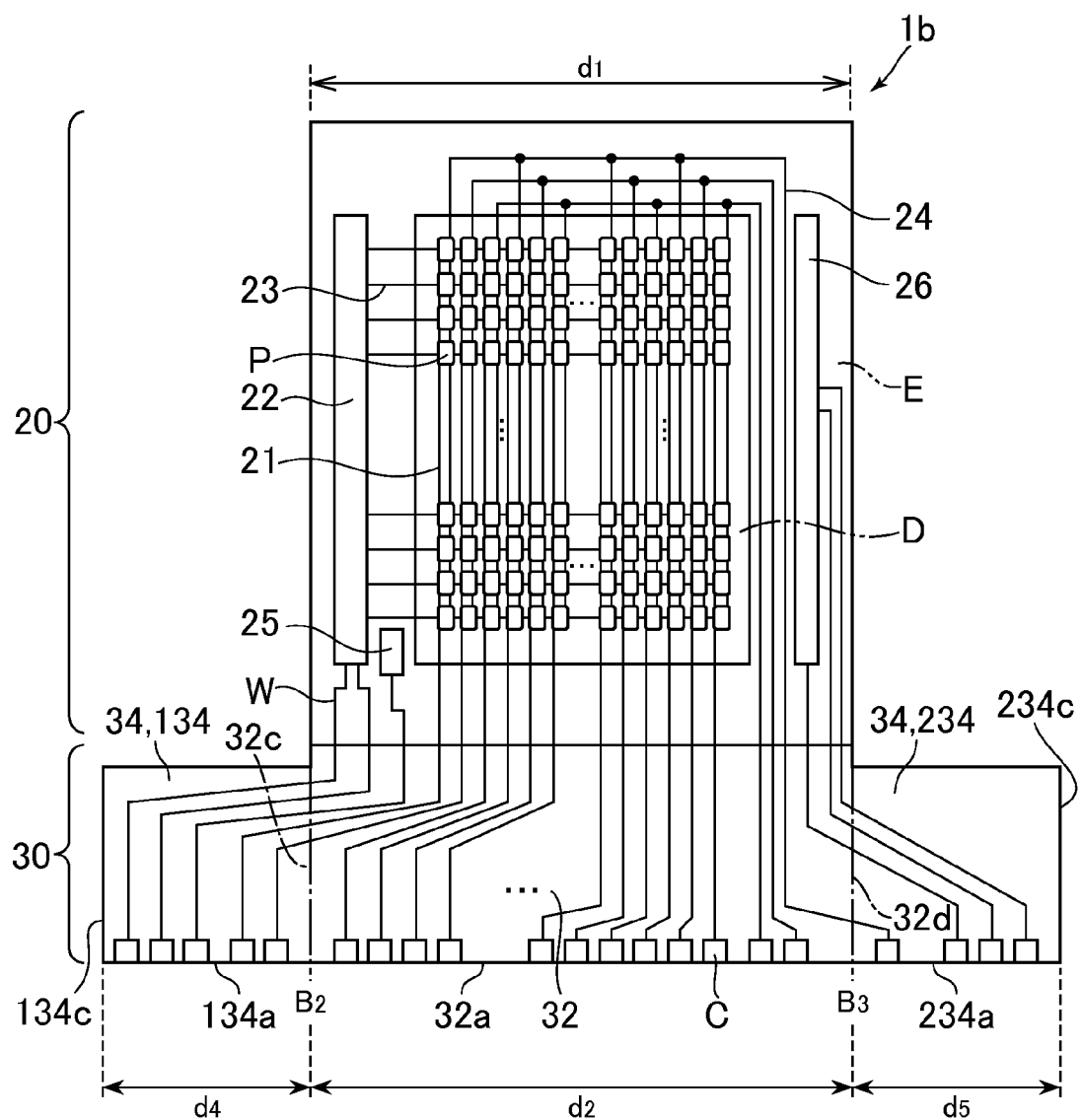
FIG. 7 is a schematic plan view illustrating a state in which a display device according to a second embodiment of the present invention has developed a terminal portion.

Next, a display device (organic electroluminescence display device) 1b according to a second embodiment of the present invention is described. FIG. 7 is a schematic plan view illustrating a state in which the display device 1b according to the second embodiment of the present invention has developed the terminal portion 30.

The display device 1b according to the second embodiment differs from the display device 1a according to the first embodiment in that the second portion 34 has a first sub-portion 134 and a second sub-portion 234. In the following, the configuration of the first sub-portion 134 and the second sub-portion 234 is described. A description of the parts that are the same as in the display device 1a according to the first embodiment is omitted.

As illustrated in FIG. 7, the first sub-portion 134 is connected to an edge 32c on one side ($X_1$ direction side) of the first portion 32, and the second sub-portion 234 is connected to an edge 32d on the other side ($X_2$ direction side) of the first portion 32. Further, an edge portion on one side ($X_1$ direction side) in the second direction of the first sub-portion 134 is referred to as an edge portion 134c, and an edge portion on the other side ($X_2$ direction side) in the second direction of the second sub-portion 234 is referred to as an edge portion 234c.

A boundary of the first portion 32 with the first sub-portion 134 is referred to as a boundary $B_2$, and a boundary of the first portion 32 with the second sub-portion 234 is referred to as a boundary $B_3$. In the terminal portion 30, at edge portions on the $Y_1$ direction side of the first portion 32, the first sub-portion 134, and the second sub-portion 234, respectively, the connection pads C are arranged so as to avoid the boundary $B_2$ and the boundary $B_3$.

When the side surface on the first direction side ($Y_1$ direction side) of the first sub-portion 134 is referred to as a side surface 134a, and the side surface on the first direction side of the second sub-portion 234 is referred to as a side surface 234a, in a planar view, the side surface 32a of the first portion, the side surface 134a, and the side surface 234a have a continuous linear shape.

Further, as illustrated in FIG. 7, a sum of the width $d_2$ in the second direction ($X_1$ direction) of the first portion 32, a width $d_4$ in the second direction of the first sub-portion 134, and a width $d_5$ in the second direction of the second sub-portion 234 is greater than the width $d_1$ in the second direction of the panel portion 20.

Figure 8:
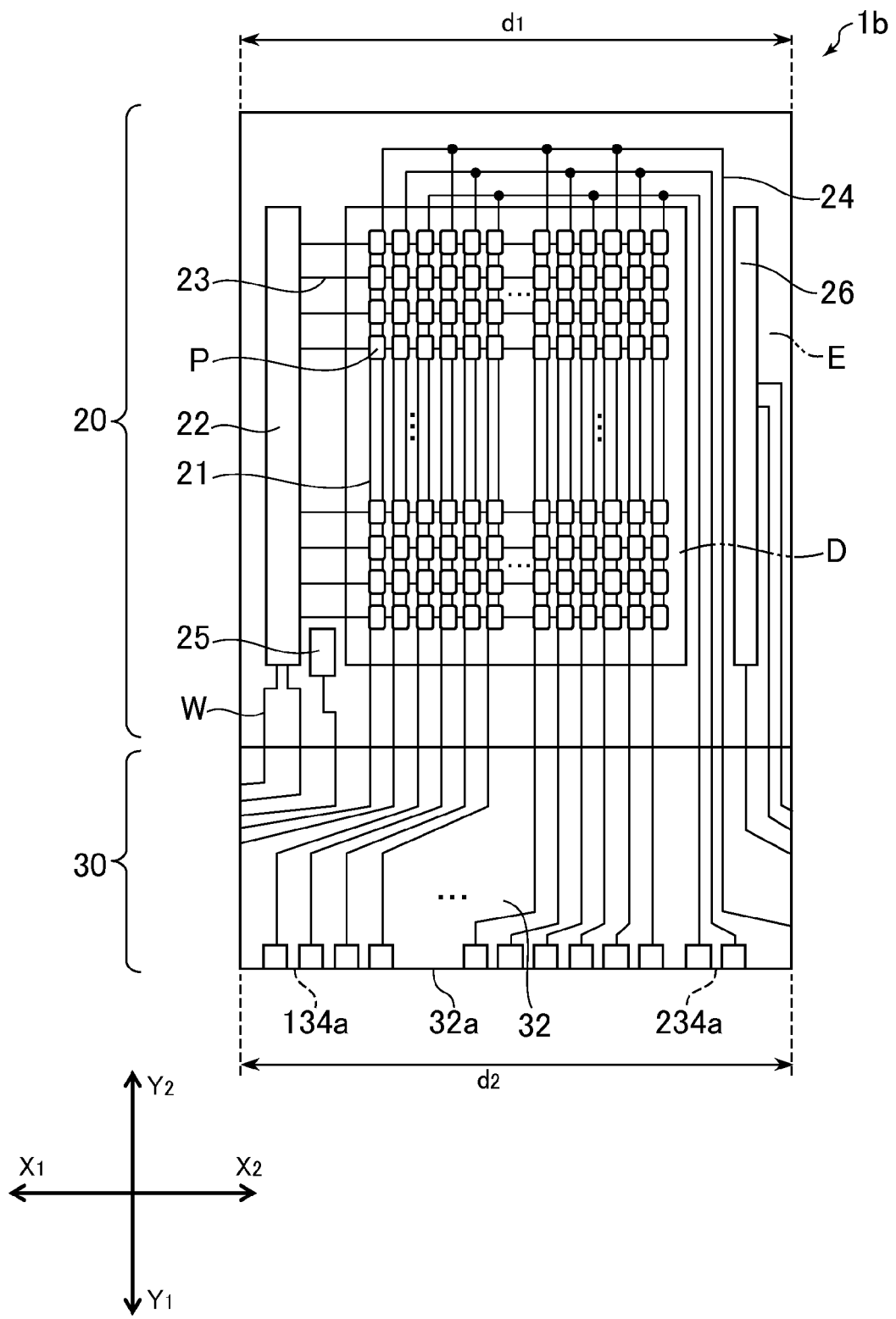
FIG. 8 is a schematic plan view illustrating a state in which portions of the terminal portion of the display device illustrated in FIG. 7 are bent.

The first sub-portion 134 and the second sub-portion 234 are formed so as to be bendable from the first portion 32 at the boundary $B_2$ and the boundary $B_3$, respectively. FIG. 8 is a schematic plan view illustrating a state in which portions of the terminal portion 30 of the display device 1b illustrated in FIG. 7 are bent. The first sub-portion 134 is bent at the boundary $B_2$, and the second sub-portion 234 is bent at the boundary $B_3$. Therefore, the width $d_1$ in the second direction of the panel portion 20 and the width $d_2$ in the second direction of the terminal portion 30 in a planar view shape are the same.

Further, it is preferred that the first sub-portion 134 and the second sub-portion 234 be each bent so that the side surface 32a of the first portion and the side surface 134a of the first sub-portion 134 overlap in a planar view, and that the side surface 32a of the first portion and the side surface 234a of the second sub-portion 234 overlap in a planar view.

Figure 9:
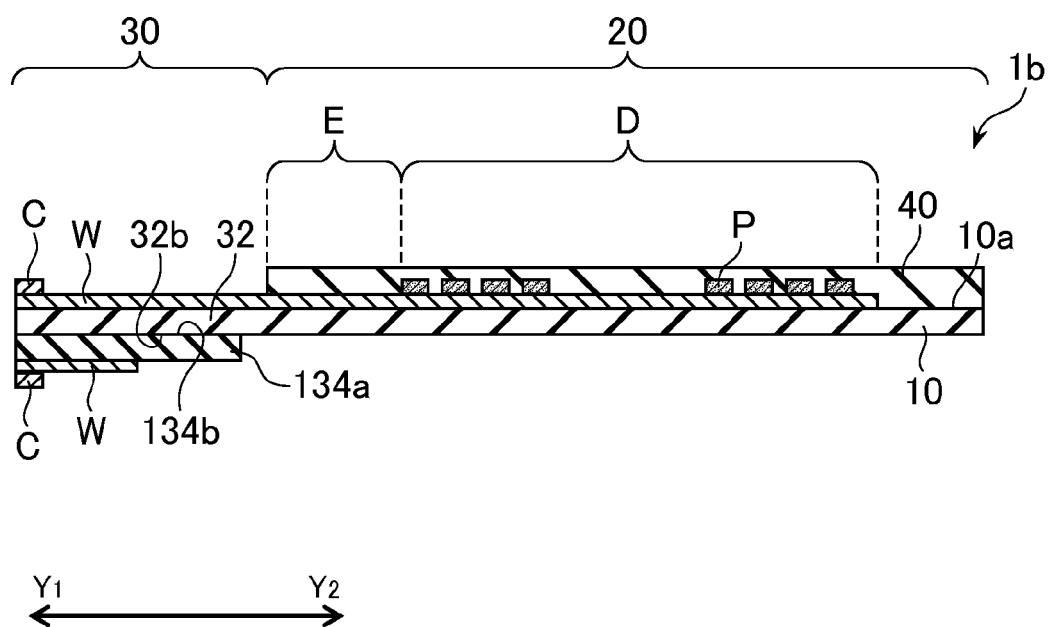
FIG. 9 is a schematic cross-sectional view illustrating the display device illustrated in FIG. 7 in the same field of view as FIG. 2.
Figure 10:
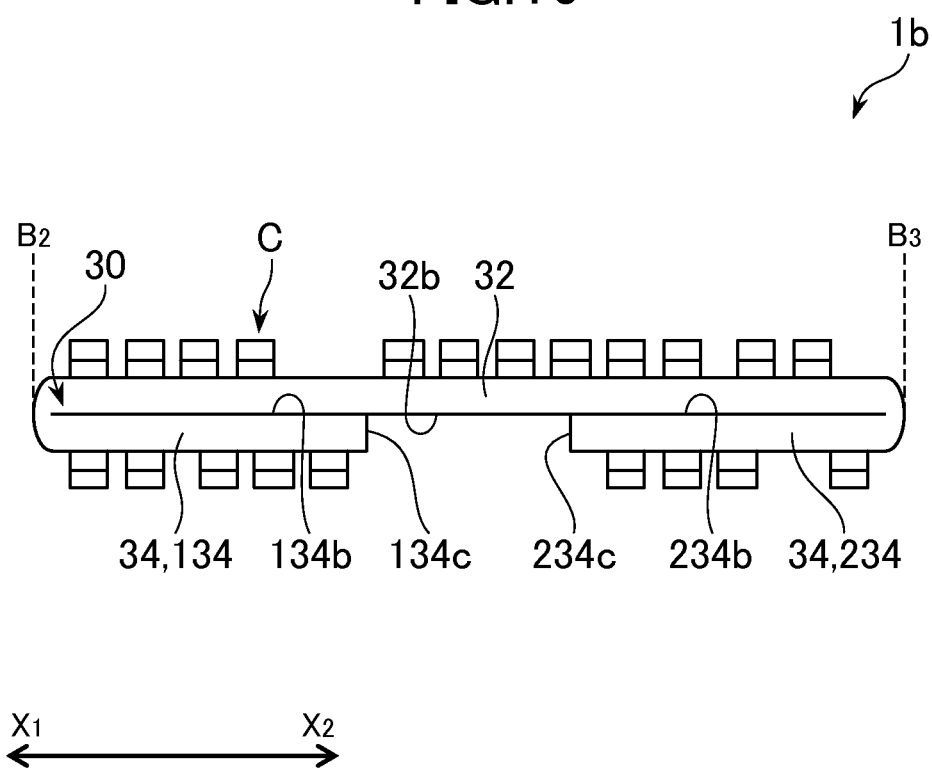
FIG. 10 is a schematic side view illustrating the display device illustrated in FIG. 7 in the same field of view as FIG. 3.

FIG. 9 is a schematic cross-sectional view illustrating the display device 1b illustrated in FIG. 7 in the same field of view as FIG. 2. FIG. 10 is a schematic side view illustrating the display device 1b illustrated in FIG. 7 in the same field of view as FIG. 3. Note that, for the convenience in description, the connector 200 is not shown in FIG. 9 or FIG. 10.

As illustrated in FIGS. 9 and 10, the first sub-portion 134 and the second sub-portion 234 of the terminal portion 30 are bent so as to oppose the first portion 32. Specifically, another surface 134b of the first sub-portion 134 and another surface 234b of the second sub-portion 234 are bent so as to oppose the another surface 32b of the first portion 32.

As illustrated in FIG. 10, by having such a configuration, the edge portion 134c on the second direction side of the first sub-portion 134 faces the edge portion 234c on the second direction side of the second sub-portion 234. Note that, the edge portion 134c may be separated from the edge portion 234c.

In the display device 1b according to this embodiment, the first sub-portion 134 is positioned on one side ($X_1$ direction side) of the first portion 32, and the second sub-portion 234 is positioned on the opposite side ($X_2$ direction side) to the first sub-portion 134 so as to sandwich the first portion 32. With this, compared with a display device that does not have this configuration, the display device 1b includes a greater number of connection pads C arranged on the terminal portion 30 without increasing the width in the second direction. Consequently, a high-resolution and compact display device can be realized.

Further, in the display device 1b according to this embodiment, the edge portion 134c on the second direction side of the first sub-portion 134 opposes the edge portion 234c on the second direction side of the second sub-portion 234. With this, compared with a display device that does not have this configuration, the distance from the boundary ($B_2$ or $B_3$) between the first portion 32 and the second portion 34 to each edge portion (134c or 234c) of the second portion 34 is shortened. Consequently, deviation of the side surface (134a or 234a) of the second portion 34 with the side surface 32a of the first portion 32 in a planar view can be prevented. Consequently, defects in the terminal portion 30 can be prevented while securing the arrangement region of the connection pads C.

In addition, in the display device 1b according to this embodiment, the second portion 34 is positioned on both one side and the opposite side of the first portion 32, and hence variation in the arrangement of not only the terminal portion 30, but also the wires W in the panel portion 20 and the like, can be increased. Specifically, as illustrated in FIG. 7, the scanning line drive circuit 22 can be arranged on one side ($X_1$ direction side) of the display region D of the panel portion 20, and a touch panel control circuit 26 can be arranged on the opposite side thereto ($X_2$ direction side).

Figure 11:
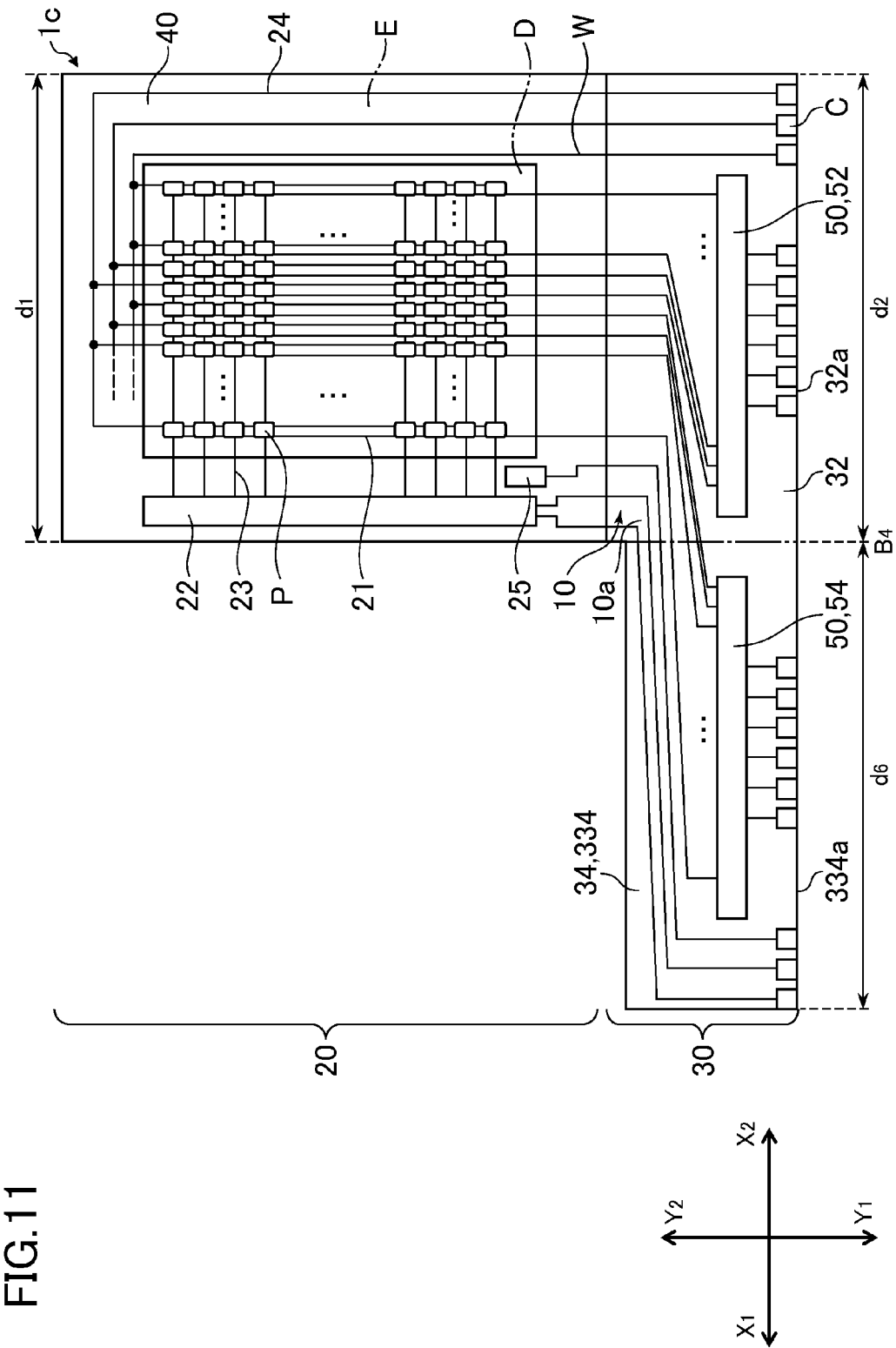
FIG. 11 is a schematic plan view illustrating a state in which a display device according to a third embodiment of the present invention has developed a terminal portion.

Next, a display device (organic electroluminescence display device) 1c according to a third embodiment of the present invention is described. FIG. 11 is a schematic plan view illustrating a state in which the display device 1c according to the third embodiment of the present invention has developed the terminal portion 30.

The display device 1c according to the third embodiment differs from the display device 1a according to the first embodiment in that a driver IC 50 connected to the plurality of connection pads C is arranged in the terminal portion 30. In the following, the configuration of the driver IC 50 is described. A description of the parts that are the same as in the display device 1a according to the first embodiment is omitted.

As illustrated in FIG. 11, the terminal portion 30 of the display device 1c has a second portion 34 (334) continuing to the $X_1$ direction side of the first portion 32. A width $d_6$ in the $X_1$ direction of the second portion 334 is only required to be equal to or smaller than the width $d_2$ in the $X_1$ direction of the first portion 32.

The driver IC 50 is mounted in each of the first portion 32 and the second portion 334. The driver IC 50, which is supplied with image data via the connection pads C from outside, is an IC that is arranged on the terminal portion 30 of the substrate 10. When image data is supplied, the driver IC 50 supplies a voltage signal to be applied to each pixel P via a data line (not shown).

In this embodiment, the driver IC 50 mounted in the first portion 32 is referred to as a first driver IC 52, and the driver IC 50 mounted in the second portion 334 is referred to as a second driver IC 54. When the boundary between the first portion 32 and the second portion 334 is referred to as a boundary $B_4$, the first driver IC 52 and the second driver IC 54 are arranged so as to avoid the boundary $B_4$.

Further, when the side surface on the first direction side ($Y_1$ direction side) of the second portion 334 is referred to as a side surface 334a, in a planar view, the side surface 32a of the first portion 32 and the side surface 334a of the second portion 334 have a continuous linear shape.

Figure 12:
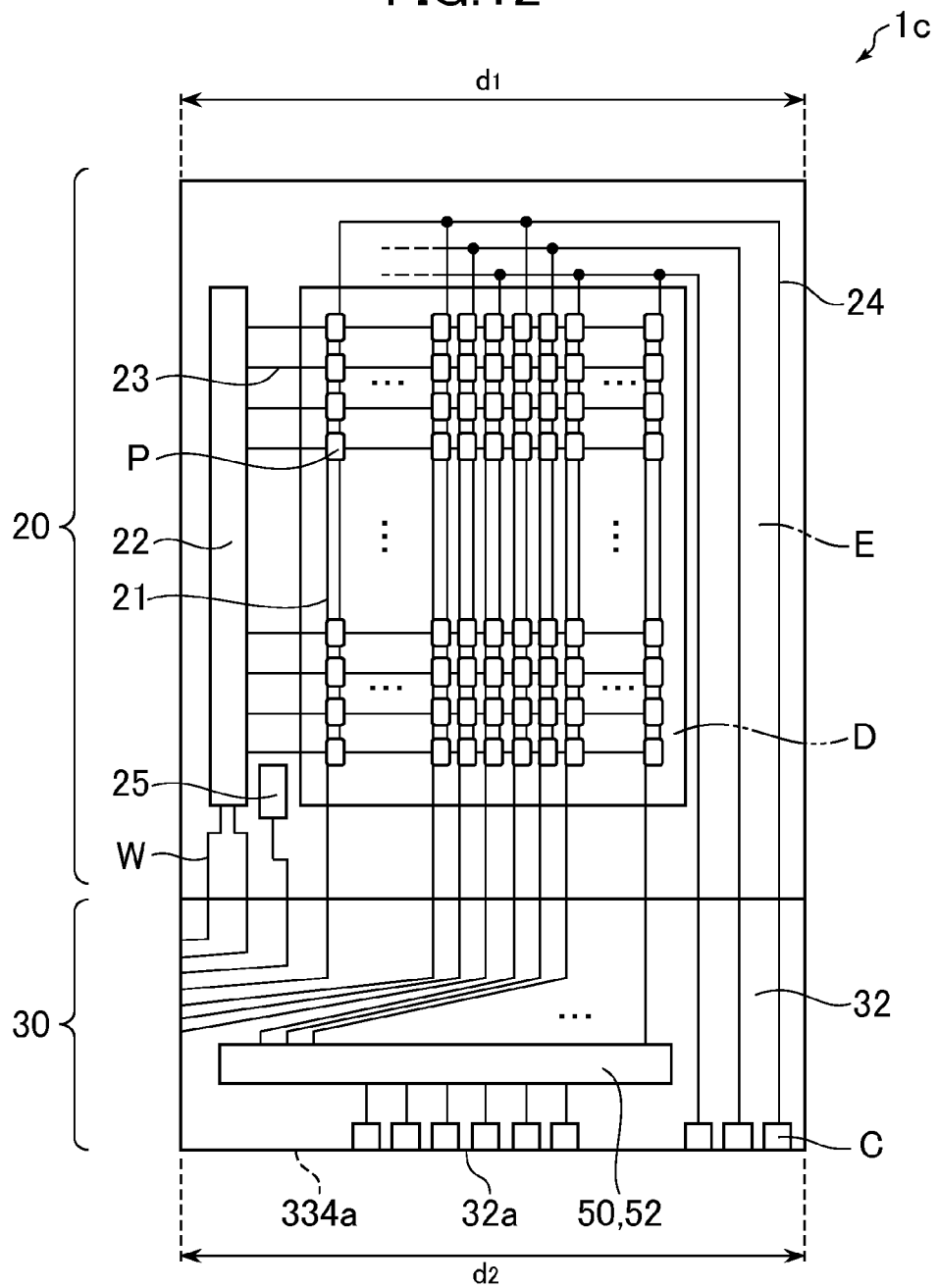
FIG. 12 is a schematic plan view illustrating a state in which a portion of the terminal portion of the display device illustrated in FIG. 11 is bent.

FIG. 12 is a schematic plan view illustrating a state in which a portion of the terminal portion 30 of the display device illustrated in FIG. 11 is bent. The second portion 334 is bent at the boundary $B_4$, and hence the width $d_1$ in the second direction of the panel portion 20 and the width $d_2$ in the second direction of the terminal portion 30 in a planar view shape are the same. Further, it is preferred that the second portion 334 be bent so that the side surface 32a of the first portion and the side surface 334a of the second portion 334 overlap in a planar view.

Figure 13:
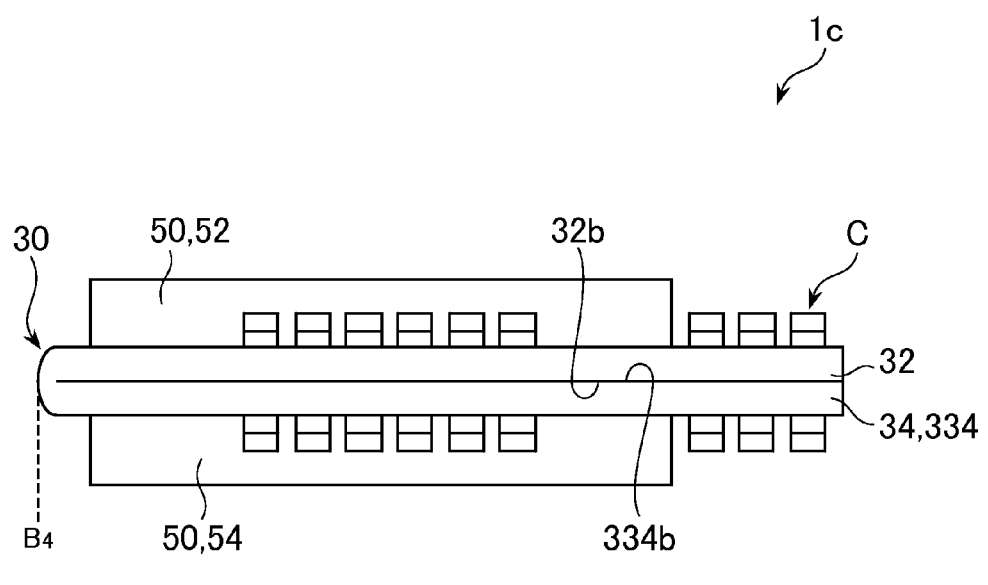
FIG. 13 is a schematic side view illustrating the display device illustrated in FIG. 11 in the same field of view as FIG. 3.

FIG. 13 is a schematic side view illustrating the display device 1c illustrated in FIG. 11 in the same field of view as FIG. 2. Note that, for the convenience in description, the connector 200 is not shown in FIG. 11. As illustrated in FIG. 11, the second portion 334 of the terminal portion 30 is bent so as to oppose the first portion 32. Specifically, the second portion 334 is bent so that another surface 334b thereof opposes the another surface 32b of the first portion 32.

In addition, the first driver IC 52 and the second driver IC 54 are arranged so as to avoid the boundary $B_4$, and hence, due to the bending of the second portion 334, the first driver IC 52 and the second driver IC 54 oppose each other with the first portion 32 and the second portion 334 sandwiched therebetween.

The display device 1c according to this embodiment is configured so that a portion (the second portion 334) of the terminal portion 30 is bent, and so that a plurality of driver ICs 50 (first driver IC 52 and second driver IC 54) are arranged on the terminal portion 30 so as to avoid the boundary $B_4$. Consequently, the layout of the connection pads C and the wires W can be designed more efficiently.

As a result, a plurality of driver ICs 50 can be arranged in a number that matches the number of connection pads C, even for a configuration in which more connection pads C are arranged than in a display device that does not have the above-mentioned configuration.

Although embodiments of the present invention have been described above, the present invention is not limited to the above-mentioned embodiments. For example, the structures described in the above-mentioned embodiments may be replaced with structures that are essentially the same, structures that provide essentially the same operation and effect, or structures capable of achieving the same purpose.

For example, the display device according to the embodiments is not limited to an organic electroluminescence display device, as long as the display device is formed by bending a portion of the terminal portion 30.

Figure 14:
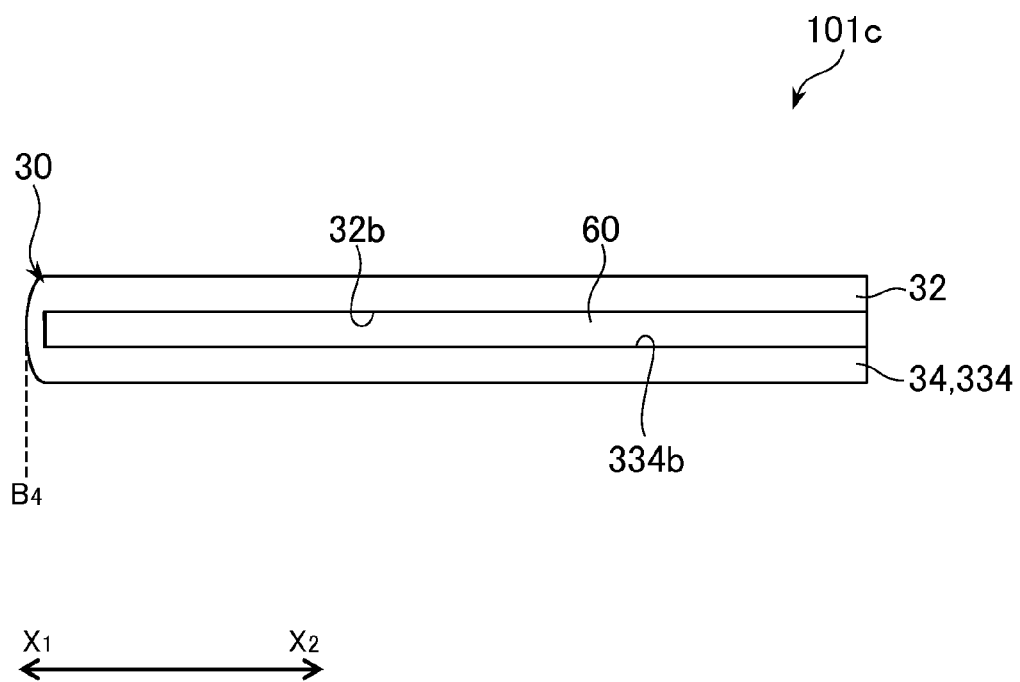
FIG. 14 is a schematic side view illustrating a modified example of the display device according to an embodiment of the present invention in the same field of view as FIG. 3.

Further, in the display device according to the embodiments, it is not necessary for the another surface 32b of the first portion 32 and the another surface 34b of the second portion 34 to be in direct contact, as long as the second portion 34 opposes the first portion 32. FIG. 14 is a schematic side view illustrating a modified example (101c) of the display device 1c according to the third embodiment in the same field of view as FIG. 3. Note that, for convenience in description, the connection pads C and the driver ICs 50 are not shown in FIG. 14.

Specifically, as illustrated in FIG. 14, a reinforcing member 60 may be arranged between the another surface 32b of the first portion 32 and the another surface 334b of the second portion 34. The material of the reinforcing member 60 is not especially limited, and may be a plate-like member formed from a resin or a metal, or even a curable adhesive agent or double-sided tape.

By fixing the another surface 32b of the first portion 32 and the another surface 34b of the second portion 34 to each other with the reinforcing member 60 arranged therebetween, compared with a display device that does not have this configuration, the display device 101c according to this embodiment can prevent, for example, deformation of the terminal portion 30 and connection defects caused by misalignment of the first portion 32 and the second portion 34.

Figure 15:
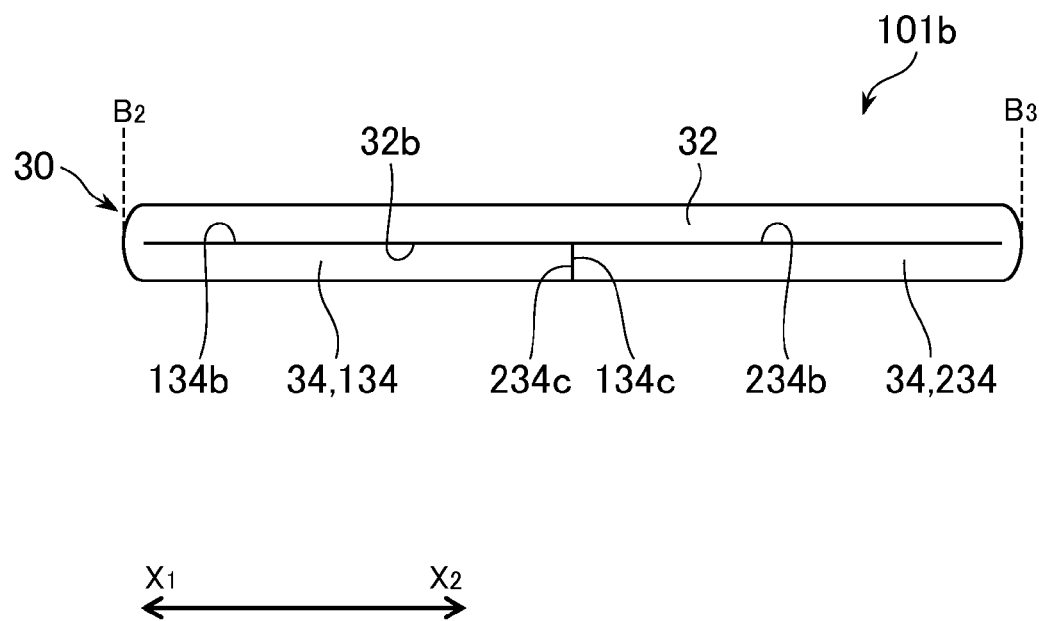
FIG. 15 is a schematic side view illustrating a modified example of the display device according to an embodiment of the present invention in the same field of view as FIG. 3.

Further, in the display device according to the embodiments, the length on the $X_1$ direction side of the second portion 34 may be the same as the length on the $X_1$ direction side of the first portion 32. FIG. 15 is a schematic side view illustrating a modified example (101b) of the display device 1b according to the second embodiment in the same field of view as FIG. 3. Note that, for convenience in description, the connection pads C is not shown in FIG. 15.

Specifically, as illustrated in FIG. 15, the edge portion 134c of the first sub-portion 134 and the edge portion 234c of the second sub-portion 234 may be connected to each other by bending each of the second portions 34 (134 and 234).

Further, although, in the third embodiment, an example has been described in which two driver ICs 50 are mounted in the terminal portion 30, the number of driver ICs 50 may be more than two, as long as the driver ICs 50 are arranged so as to avoid the boundary between the first portion 32 and the second portion 34.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device, comprising:
    a substrate on which a plurality of pixels are arranged in a display region;
    a plurality of connection pads provided on one surface of the substrate; and
    wires connecting the plurality of pixels and the plurality of connection pads to each other,
    the substrate comprising:
        a panel portion in which the plurality of pixels are arranged; and
        a terminal portion in which the plurality of connection pads are arranged,
    the terminal portion comprising:
        a first portion continuing to a first direction side of the panel portion; and
        a second portion opposing the first portion, the second portion being formed by bending a portion of the terminal portion,
    the plurality of connection pads being arranged in the first portion and the second portion.

2. The display device according to claim 1, wherein a sum of a width in a second direction, which is a direction orthogonal to the first direction, of the first portion and a width in the second direction of the second portion is greater than a width in the second direction of the panel portion.

3. The display device according to claim 1, wherein a side surface on the first direction side of the first portion and a side surface on the first direction side of the second portion overlap in a planar view.

4. The display device according to claim 1,
    wherein the second portion comprises:
        a first sub-portion; and
        a second sub-portion,
    wherein the first sub-portion is connected to an edge on one side of the first portion,
    wherein the second sub-portion is connected to an edge on another side of the first portion, and
    wherein an edge portion on the second direction side of the first sub-portion faces an edge portion on the second direction side of the second sub-portion on the another side.

5. The display device according to claim 1, further comprising a driver IC connected to a plurality of the connection pads, the driver IC being arranged on the terminal portion so as to avoid a boundary between the first portion and the second portion.

6. The display device according to claim 1, wherein a surface on an opposite side to the one surface of the first portion and a surface on an opposite side to the one surface of the second portion are fixed through intermediation of a reinforcing member.

* * * * *